(12) United States Patent
Putter

(10) Patent No.: US 8,659,350 B2
(45) Date of Patent: Feb. 25, 2014

(54) CIRCUIT FOR AN AMPLIFIER

(75) Inventor: Bas Maria Putter, Adliswil (CH)

(73) Assignee: St-Ericsson SA, Plan-les-Ouates (CH)

( * ) Notice: Subject to any disclaimer, the term of this patent is extended or adjusted under 35 U.S.C. 154(b) by 45 days.

(21) Appl. No.: 13/377,191

(22) PCT Filed: Jun. 11, 2010

(86) PCT No.: PCT/EP2010/003537
§ 371 (c)(1),
(2), (4) Date: Feb. 21, 2012

(87) PCT Pub. No.: WO2010/142460
PCT Pub. Date: Dec. 16, 2010

(65) Prior Publication Data
US 2012/0139646 A1 Jun. 7, 2012

(30) Foreign Application Priority Data
Jun. 12, 2009 (EP) ..................... 09251545

(51) Int. Cl.
*H03F 1/02* (2006.01)
(52) U.S. Cl.
USPC .............................. 330/9; 327/536
(58) Field of Classification Search
USPC ............... 330/9; 327/536; 363/59, 60
See application file for complete search history.

(56) References Cited

U.S. PATENT DOCUMENTS

| | | | |
|---|---|---|---|
| 6,995,995 B2 * | 2/2006 | Zeng et al. | ...................... 363/60 |
| 2007/0040611 A1 | 2/2007 | Noro et al. | |
| 2007/0229169 A1 | 10/2007 | Doy et al. | |

FOREIGN PATENT DOCUMENTS

| | | |
|---|---|---|
| EP | 1 128 549 A2 | 8/2001 |
| WO | 2006/031304 A2 | 3/2006 |

OTHER PUBLICATIONS

International Search Report in corresponding International Application No. PCT/EP2010/003537 mailed Sep. 30, 2010.
Written Opinion of the International Searching Authority in corresponding International Application No. PCT/EP2010/003537 mailed Sep. 30, 2010.

* cited by examiner

*Primary Examiner* — Robert Pascal
*Assistant Examiner* — Khiem Nguyen
(74) *Attorney, Agent, or Firm* — Patent Portfolio Builders PLLC

(57) ABSTRACT

An amplifier (1) includes an analogue-to-digital converter (ADC) (7) and a switched capacitor output stage (8). The ADC (7) converts an analogue signal into a digital signal containing a sequence of symbols. The switched capacitor output stage (8) charges and discharges a capacitor to produce charge pulses at an output (3). During discharge, switches selectively couple the capacitor to the output (3) in opposite directions to produce charge pulses of opposing polarity. The values of the symbols in the digital signal are used to decide the polarity of charge pulses. In this manner, amplification can be achieved without introducing a direct current (DC) component to the signal at the output (3).

30 Claims, 6 Drawing Sheets

CIRCUIT FOR AN AMPLIFIER

FIELD OF THE DISCLOSURE

The present disclosure relates to a circuit for an amplifier. In particular, but not exclusively, the disclosure relates to an amplifier for use in a portable audio device.

BACKGROUND TO THE DISCLOSURE

Amplifiers used in portable audio devices are typically powered by a power source providing a supply voltage $V_{dd}$. An analogue signal representing audio information is input to the amplifier. The amplifier outputs an amplified signal biased midway between the supply voltage $V_{dd}$ and ground; that is, biased at $V_{dd}/2$. In this way, the amplified signal can extend across the full range of available voltages, or from the supply voltage $V_{dd}$ to ground, without distortion. Moreover, this approach also ensures that both positive and negative fluctuations in the input analogue signal are represented in the amplified signal.

The amplified signal is output to a speaker, which in the case of a portable audio device is typically contained in headphones. The speaker is in turn connected to ground. As such, the bias voltage of the amplified signal results in an average voltage across the speaker of $V_{dd}/2$. As a result, there is a Direct Current (DC) component in the amplified signal that constantly passes through the speaker. This is undesirable as it may damage the speaker.

In order to prevent the DC component reaching the speaker it has been proposed to couple a capacitor in line between the output of the amplifier and the speaker. The capacitor effectively acts as a high pass filter, preventing signals below a certain frequency being propagated to the speaker. The cut-off frequency of such a filter depends on the capacitance of the capacitor, and also upon the impedance of the speaker. In practice, a large capacitance is required if all audible frequencies are to reach the headphones. In a particular example, this capacitance is 220 µF.

Capacitors having capacitance in the order of hundreds of µF typically have relatively large physical dimensions, and cannot be integrated into a microchip. Instead, the amplifier might be integrated onto the microchip and the large capacitor provided external to the microchip on a circuit board on which the microchip is mounted. In the context of a portable audio device, this limits miniaturisation and adds complexity to the device.

It has also been proposed to provide two equal and opposite supply voltages, $V_{dd}$ and $-V_{dd}$, to the amplifier. The signal output by the amplifier may then be biased at ground. As a result, there is no DC component in the output signal.

An example of such a system is described in international (PCT) patent publication no. WO 2006/031304. In particular, this document describes the use of a DC voltage-to-voltage converter to provide a negative supply voltage, $-V_{dd}$, from the initial positive supply voltage, $V_{dd}$, provided by the power source.

However, the DC voltage-to-voltage converter requires additional capacitors and/or inductors which cannot be integrated onto a microchip. In a particular example, two capacitors are required, each having a capacitance of 1 µF. Although this is significantly lower than the capacitance of the in-line capacitor described above, the capacitors still cannot be integrated easily onto a microchip so must be provided external to the microchip like the in-line capacitor. Specifically, the addition of these two capacitors requires three extra pins on the microchip; one capacitor is connected between a pin and ground, while the other is connected between two separate pins. This approach therefore takes up additional space and does not miniaturise the amplifier to the extent that may be desired.

Moreover, the regulation of the DC voltage-to-voltage converter in order to provide the correct output is not trivial and must be carefully managed. As a result, there are cost implications in the application of this approach, and also potential instability in the amplifier if the regulation is unsuccessful.

SUMMARY OF THE PREFERRED EMBODIMENTS

According to a first aspect, there is provided a circuit comprising:

an input for receiving an analogue input signal;

an analogue-to-digital conversion stage operable to convert the analogue input signal into a digital signal comprising a plurality of symbols each having one of a plurality of different values; and a first output stage coupled to receive the digital signal from the analogue-to-digital conversion stage, the first output stage comprising a first energy storage element and being operable to discharge the first energy storage element to produce first charge pulses in an output signal, the polarity of the first charge pulses depending upon values of the symbols received from the analogue-to-digital conversion stage.

According to a second aspect, there is provided a method comprising:

receiving an analogue input signal;

converting the analogue input signal to a digital signal comprising a plurality of symbols each having one of a plurality of different values; and receiving the digital signal and discharging a first energy storage element to produce first charge pulses in an output signal, the polarity of the first charge pulses depending upon values of the symbols in the digital signal.

This can provide an output signal for a speaker that contains substantially no DC component. As such, no external capacitors are required to remove the DC component. Moreover, there is no reliance on the provision of two counterbalancing supply voltages to avoid a DC component in the output signal. There is no need therefore to provide additional circuitry to create such a counterbalancing drive voltage, or to provide a positive and negative supply voltage initially.

The first energy storage element is preferably discharged periodically. The digital signal is typically output at a symbol rate, the symbol rate defining a number of symbols in the digital signal per unit of time. The first energy storage element is then preferably discharged at the symbol rate. That is to say, the energy storage element is discharged once for each symbol. In alternative examples, the energy storage element may be discharged at a higher or lower rate than the symbol rate.

The symbol rate is preferably at least 20 MHz. More preferably, the symbol rate is approximately 40 MHz. It is desirable to have a relatively large symbol rate in order to ensure that the symbols do not interfere with the frequencies carried by the analogue input signal. For example, if the analogue input signal represents an audio signal it is beneficial that the symbols do not provide interference with audio information represented by the analogue input signal.

In preferred examples, the first energy storage element is a capacitive element. However, alternative elements can be used, such as an inductive element. A high symbol rate allows a capacitive element used as the first energy storage element to be effective even if it has only a relatively low capacitance. This assists in the miniaturisation of the capacitive element and therefore the circuit as a whole. In preferred examples, the capacitive element has a capacitance of less than 10 nF. More preferably, the capacitive element has a capacitance of approximately 1 nF.

Preferably, the circuit further comprises a second output stage coupled to receive the digital signal from the analogue-to-digital conversion stage, the second output stage comprising a second additional energy storage element and being operable to discharge the second energy storage element to produce second charge pulses in the output signal, the polarity of the second charge pulses depending upon values of the symbols received from the analogue-to-digital conversion stage. Likewise, the method preferably further comprises discharging a second energy storage element to produce second charge pulses in the output signal, the polarity of the second charge pulses depending upon values of the symbols in the digital signal. So, second charge pulses can be provided in addition to the first charge pulses.

The second output stage may have the same features as the first output stage. Likewise, the second charge pulses may be produced in the same way as the first charge pulses. However, the first and second, charge pulses are preferably alternately and sequentially produced. In this way, the first and second charge pulses complement each other and can provide an output signal with a higher density of charge pulses. Moreover, this allows the first energy storage element to be charged while the second energy storage element is discharged, and vice versa.

For example, the symbols can each be received in a period of time comprising a first portion and a second portion, and the first energy storage element can be charged during the first portion and discharged to produce one of the first charge pulses during the second portion. Similarly, the second storage element can be charged during the second portion and discharged to produce one of the second charge pulses during the first portion. The first portion preferably precedes the second portion.

Preferably, for a second symbol following a first symbol of the digital signal, the second energy storage element is charged during a period of time in which the first symbol is received and discharged to produce one of the second charge pulses, the polarity of which depends upon the value of the first symbol, during a period of time in which the second symbol is received. In this way, the second energy storage element can be charged before the period during which the second symbol is received. This allows the second energy storage element to be discharged as soon as that period begins.

Preferably, the second energy storage element is charged during the second portion of the period of time in which the first symbol is received and discharged to produce one of the second charge pulses, the polarity of which depends upon the value of the first symbol, during the first portion of the period of time in which the second symbol is received.

Preferably, the first energy storage element is charged during the first portion of the period of time in which the second symbol is received and discharged to produce one of the first charge pulses, the polarity of which depends upon the value of the first symbol, during a second portion of the period of time in which the second symbol is received.

Preferably, the first symbol of the digital signal immediately precedes the second symbol of the digital signal.

Preferably, the analogue-to-digital conversion stage comprises an analogue-to-digital converter operable to convert the analogue input signal into the digital signal received both by the first output stage and by the second output stage. In this way, a single analogue-to-digital converter is used to control both the first and second output stages. Alternatively, the analogue-to-digital conversion stage may comprise a first analogue-to-digital converter operable to convert the analogue signal into the digital signal received by the first output stage and a second analogue-to-digital converter operable to convert the analogue signal into the digital signal received by the second output stage.

The analogue-to-digital converter(s) can be 1-bit. For example, the symbols of the digital signal(s) can have a selected one of two different values and the charge pulses can have one polarity when the symbol upon which its polarity depends has one of the values and the opposite polarity when that symbol has the other of the values. This corresponds to each symbol comprising a single bit and the symbol rate being equivalent to a bit rate.

In other examples, the analogue-to-digital converters can be n-bit, where n is 1.5 or an integer greater than 1. More generally, the analogue-to-digital converters can provide symbols having a selected one of any number of different values. In these examples, preferably a level of each charge pulse depends upon the value of the symbol upon which the polarity of that charge pulse depends. For example, the symbols of the digital signal(s) can have a selected one of three different values including zero and the charge pulses can have one polarity when the symbol upon which its polarity depends has one of the non-zero values and the opposite polarity when that symbol has the other of the non-zero values. Alternatively, the symbols of the digital signal(s) can have a selected one of four different values and the charge pulses can have one polarity and a first level when the symbol upon which its polarity depends has a first of the values, the one polarity and a second level when the symbol upon which its polarity depends has a second of the values, the opposite polarity and the first level when the symbol has a third of the values and the opposite polarity and the second level when the symbol has a fourth of the values.

Preferably, the circuit further comprises a pre-amplifier coupled between the input and the analogue-to-digital converter. Similarly, the method preferably further comprises amplifying the analogue input signal before converting it into a digital signal. The pre-amplifier is effective to improve the gain characteristics of the circuit and method. For example, the pre-amplifier can be used to flatten the frequency response and improve the linearity of the circuit.

Preferably, the circuit further comprises a feedback path coupled between an output of the first output stage and the input of the circuit. Similarly, the method preferably further comprises providing a feedback signal from the output signal for summing with the analogue input signal. This allows the gain of the circuit and method to be controlled. The feedback path preferably comprises a resistive element. Likewise, the provision of the feedback signal may comprise passing the feedback signal through a resistive element. The resistive element can comprise a variable resistor.

There is also provided an amplifier comprising the circuit described above. In other words, the circuit may be provided in an amplifier. The amplifier can provide an output signal with no DC component. This is a particular benefit in preferred examples in which the amplifier is an audio amplifier. Preferably, the amplifier is integrated onto a single microchip.

There is further provided a portable audio device comprising an audio amplifier as described above. In other words, the amplifier may be provided in a portable audio device. The portable audio device benefits from the fact that the output signal is provided with no DC component without the need for relatively large capacitors, since this assists in the miniaturisation of the player.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 1:
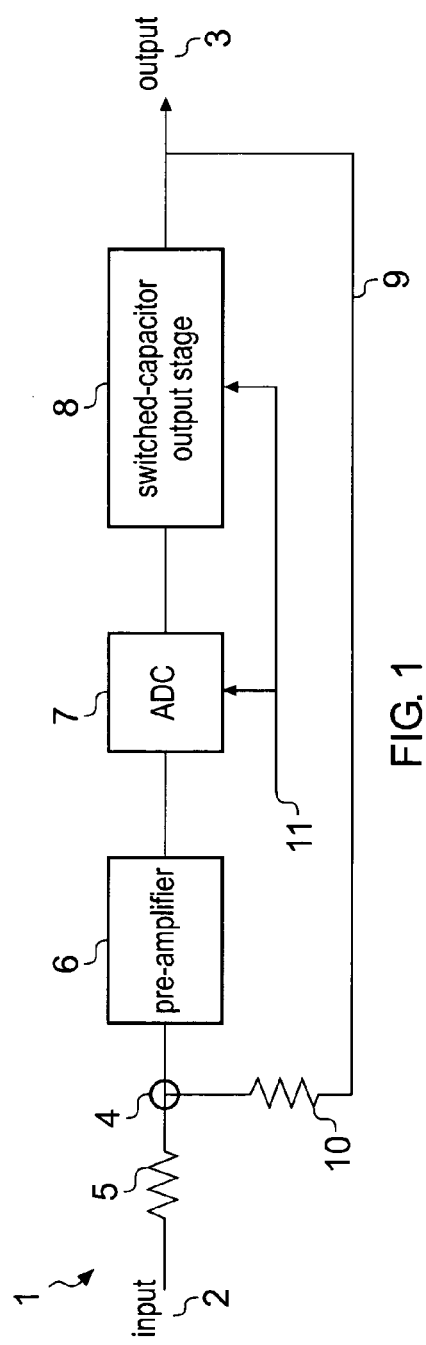
FIG. 1 is a schematic representation of an amplifier.

Referring to FIG. 1, an amplifier 1 comprises an input 2 and an output 3. The input 2 is coupled to a summing stage 4 via a first resistive element 5. An output of the summing stage 4 is coupled to an input of a pre-amplifier 6; an output of the pre-amplifier 6 is coupled to an input of an analogue to digital converter (ADC) 7; an output of the ADC 7 is coupled to an input of a switched capacitor output stage 8; and an output of the switched capacitor output stage 8 is coupled to the output 3 of the amplifier 1. A feedback path 9 is coupled from the output of the switched capacitor output stage 8 to another input of the summing stage 4 and includes a second resistive element 10.

The amplifier 1 is provided with a clock signal 11. More specifically, the clock signal 11 is provided to the ADC 7 and the switched capacitor output stage 8. If required, the clock signal 11 can also be provided to the pre-amplifier 6. The clock signal 11 is used to control the symbol rate of the ADC 7. That is, the clock signal 11 is used to control the number of symbols produced per unit of time by the ADC 7. The term "clock cycle" is used hereinafter to refer to a period of time during which a symbol is produced by the ADC 7. A symbol may comprise a number of elements, e.g. bits. In some embodiments the ADC 7 is therefore operable to produce each symbol over more than one clock cycle, with one element being produced per clock cycle. Alternatively, each clock cycle may be divided into a plurality of distinct portions during which each element of a symbol is produced.

The ADC 7 provides a digital signal to the switched capacitor output stage 8. There may or may not be a delay provided between the output by the ADC 7 and the input of the switched capacitor output stage 8. The digital signal and the clock signal 11 are used to drive switches in the switched capacitor output stage 8 to charge and discharge an energy storage element appropriately to provide charge pulses in an output signal. Depending on whether or not there is a delay, a charge pulse produced during a clock cycle can correspond to a symbol produced during that clock cycle or to a symbol produced during an earlier clock cycle.

Figure 2A:
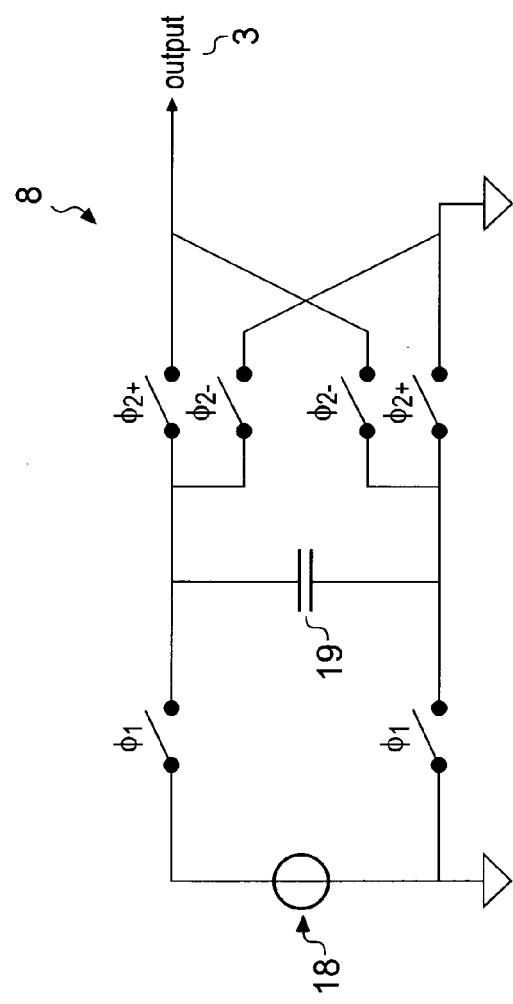
FIG. 2A is a schematic representation of a switched capacitor output stage of the amplifier shown in FIG. 1 for use with a 1-bit ADC.

In one preferred embodiment, the ADC 7 is a 1-bit ADC. Referring to FIG. 2A, in this embodiment, the switched capacitor output stage 8 comprises a voltage supply 18, an energy storage element in the form of a capacitor 19, charge cycle switches $\Phi_1$ for controlling charging of the capacitor 19 and discharge cycle switches $\Phi_{2+}$, $\Phi_{2-}$ for controlling the discharge of the capacitor 19. Two charge cycle switches $\Phi_1$ are provided, one on each side of the capacitor 19 between the capacitor 19 and the voltage supply 18. When either of the two charge cycle switches $\Phi_1$ is open (or off), the capacitor 19 is uncoupled from the voltage supply 18 and does not charge. When both of the two charge cycle switches $\Phi_1$ are closed (or on), the voltage supply 18 is coupled to the capacitor 19 and the capacitor 19 charges.

As shown in FIG. 2A, the discharge cycle switches $\Phi_{2+}$, $\Phi_{2-}$ are arranged to selectively couple the capacitor 19 to the output 3. The capacitor 19 may be considered to consist of first and second plates separated by a small distance; when first discharge cycle switches $\Phi_{2+}$ are closed and second discharge cycle switches $\Phi_{2-}$ are open, the first plate of the capacitor 19 is coupled to the output 3. In contrast, when second discharge cycle switches $\Phi_{2-}$ are closed and first discharge cycle switches $\Phi_{2+}$ are open, the second plate of the capacitor 19 is coupled to the output 3. The discharge cycle switches $\Phi_{2-}$, $\Phi_{2+}$ are arranged to connect that plate of the capacitor 19 that is not connected to the output to ground in order to allow it to discharge.

The switched capacitor output stage 8 is controlled both by the digital signal provided by the ADC 7 and by the clock signal 11. For operation of the switched capacitor output stage 8, each clock cycle (during which a symbol is received by the switched capacitor output stage 8 from the ADC 7) is considered to contain first and second portions, referred to as $\Phi_1$ and $\Phi_2$ respectively as they correspond to the switches $\Phi_1$, $\Phi_{2+}$, $\Phi_{2-}$ in the manner described below. The output of the switched capacitor output stage 8 depends on the value of a symbol in the digital signal received from the ADC 7.

The switched capacitor output stage 8 is arranged to provide a charge pulse periodically. In this particular embodiment, the switched capacitor output stage 8 provides one charge pulse during each clock cycle (that is, the switched capacitor output stage 8 provides one charge pulse during each period in which a symbol is received from the ADC 7). However, in alternative embodiments, the switched capacitor output stage 8 may produce more or less than one charge pulse per clock cycle.

During the first clock cycle portion $\Phi_1$, charge cycle switches $\Phi_1$ are closed while discharge cycle switches $\Phi_{2+}$, $\Phi_{2-}$ are open. This allows the capacitor 19 to charge from the voltage supply 18. In contrast, during the second clock cycle portion $\Phi_2$, charge cycle switches $\Phi_1$ are open. Moreover, either first discharge cycle switches $\Phi_{2+}$ or second discharge cycle switches $\Phi_{2-}$ are closed during the second clock cycle portion $\Phi_2$, depending on the value of a symbol in the digital signal provided by the ADC 7.

During the second clock cycle portion $\Phi_2$ the capacitor 19 discharges, but the direction of current flow during this discharge depends on the value of the symbol of the digital signal received from the ADC 7. This is because, as mentioned above, the discharge cycle switches $\Phi_{2+}$, $\Phi_{2-}$ control the coupling of the capacitor 19 to the output 3. The digital signal provided by the ADC 7 controls whether the first discharge cycle switches $\Phi_{2+}$ or the second discharge cycle switches $\Phi_{2-}$ are closed, thereby controlling whether the first or second plate of the capacitor 19 is coupled to the output 3. As the plates of a charged capacitor are of opposite polarity, the digital signal received from the ADC 7 will therefore control the polarity of a charge pulse produced in the output signal during the second clock cycle portion $\Phi_2$.

FIG. 2A illustrates a switched capacitor output stage 8 for use with a 1-bit ADC 7. This means that the ADC 7 provides a digital signal comprising symbols which each have one of two possible values, typically 1 and 0, dependent on which the switched capacitor output stage 8 outputs a signal with one polarity or the opposite polarity. However, ADCs having alternative bit ratings can be used. For example, any n-bit ADC can be used where n is an integer or 1.5. More generally, an ADC providing symbols having a selected one of any number of different values can be used.

Figure 2B:
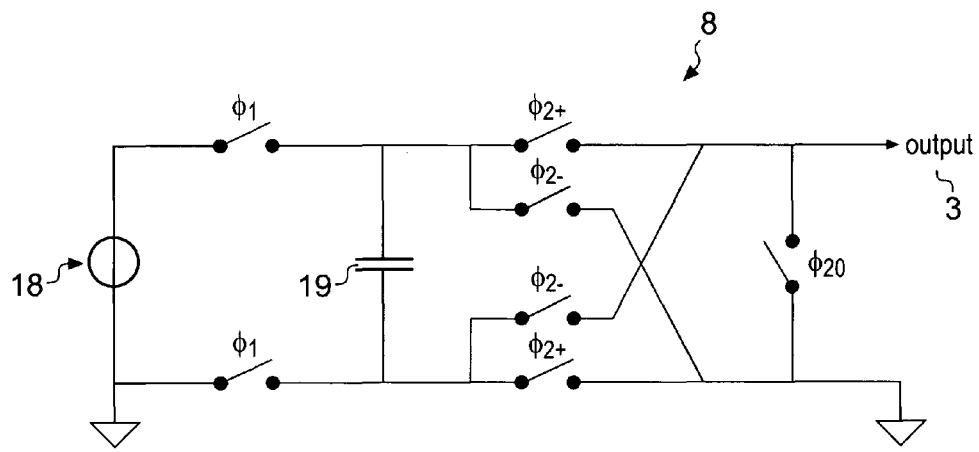
FIG. 2B is a schematic representation of a switched capacitor output stage of the amplifier shown in FIG. 1 for use with a 1.5-bit ADC.

FIG. 2B shows a switched capacitor output stage 8 for use with a 1.5-bit ADC 7. The symbols in the digital signal output by a 1.5-bit ADC have three possible values, typically 1, 0, and −1. As such, the switched capacitor output stage 8 illustrated in FIG. 2B is arranged to output a signal having three possible values during the second clock cycle portion $\Phi_2$.

As compared with the switched capacitor output stage 8 illustrated in FIG. 2A, the switched capacitor output stage 8 illustrated in FIG. 2B has an additional discharge cycle switch $\Phi_{20}$. The additional discharge cycle switch $\Phi_{20}$ is connected in parallel to the capacitor 19. In use, during the second clock cycle portion $\Phi_2$, either the first discharge cycle switches $\Phi_{2+}$, the second discharge cycle switches $\Phi_{2-}$, or the additional discharge cycle switch $\Phi_{20}$ is or are closed. This is controlled by the digital signal provided by the 1.5-bit ADC 7.

If the first or second discharge cycle switches $\Phi_{2+}$, $\Phi_{2-}$ are closed during the second clock cycle portion $\Phi_2$ a charge pulse is produced in the manner described above with relation to FIG. 2A. However, when the additional discharge cycle switch $\Phi_{20}$ is closed both the first and second discharge cycle switches $\Phi_{2+}$, $\Phi_{2-}$ are open and the capacitor 19 is not discharged meaning that the signal provided to the output 3 is zero. The switched capacitor output stage 8 therefore provides a signal having three alternative values (of one polarity, the opposite polarity and zero), depending on the three possible values of the symbols in the digital signal provided by the 1.5-bit ADC 7.

As indicated previously, in other preferred embodiments the ADC 7 can have a bit rating of 2 or more. In such circumstances the switched capacitor output stage 8 is arranged to respond to the various output values that may be represented by the digital signal provided by the ADC 7. In general, a symbol in a digital signal output by an n-bit ADC 7 has $2^n$ potential values, where n is an integer. For example, the symbols in a digital signal provided by a 2-bit ADC have four possible values, typically 0, 1, 2 and 3.

Figure 2C:
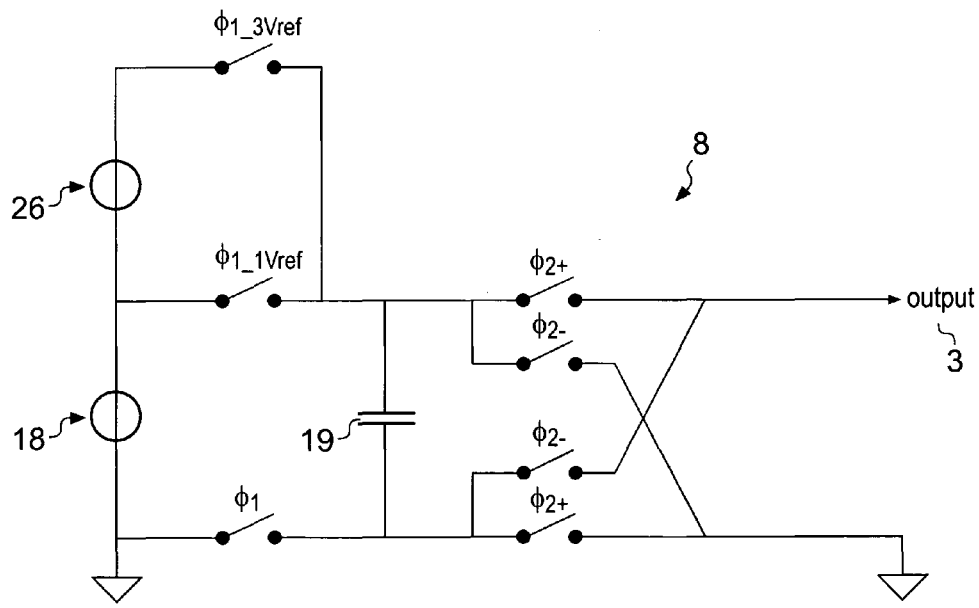
FIG. 2C is a schematic representation of a switched capacitor output stage of the amplifier shown in FIG. 1 for use with a 2-bit ADC.

FIG. 2C illustrates a switched capacitor output stage 8 for use with a 2-bit ADC 7. The switched capacitor output stage 8 illustrated in FIG. 2C is similar to that illustrated in FIG. 2A but includes an additional voltage supply 26. The additional voltage supply 26 is connected in series with the first voltage supply 18. In the embodiment illustrated in FIG. 2C, the first voltage supply 18 provides a first voltage $V_{ref}$ and the second voltage supply 26 provides a second voltage $2V_{ref}$ twice the first voltage provided by the first voltage supply 18.

The charge cycle switches $\Phi_1$ of the switched capacitor output stage 8 illustrated in FIG. 2C differ from those illustrated in FIG. 2A. In particular, three charge cycle switches $\Phi_1$, $\Phi_{1\_1Vref}$, $\Phi_{1\_3Vref}$ are provided. During the first clock cycle portion $\Phi_1$, two of the charge cycle switches $\Phi_1$, $\Phi_{1\_1Vref}$, $\Phi_{1\_3Vref}$ are closed while the third is open. The decision as to which of the charge cycle switches $\Phi_1$, $\Phi_{1\_1Vref}$, $\Phi_{1\_3Vref}$ are closed is made in dependence upon the value of the digital signal received from the ADC 7.

There are three types of charge cycle switches $\Phi_1$, $\Phi_{1\_1Vref}$, $\Phi_{1\_3Vref}$ provided in the switched capacitor output stage 8 illustrated in FIG. 2C. The three charge cycle switches $\Phi_1$, $\Phi_{1\_1Vref}$ and $\Phi_{1\_3Vref}$ are coupled between the voltage supplies 18, 26 and the capacitor 19. The first charge cycle switch $\Phi_1$ is coupled from between ground and the first voltage supply 18 to the first plate of the capacitor 19. The second charge cycle switch $\Phi_{1\_1Vref}$ is coupled from between the first voltage supply 18 and the additional voltage supply 26 to the second plate of the capacitor 19. The third charge cycle switch $\Phi_{1\_3VRef}$ is coupled from the other side of the additional voltage supply 26 to the second plate of the capacitor 19.

During the first clock cycle portion $\Phi_1$, the first charge cycle switch $\Phi_1$ is closed along with either the second charge cycle switch $\Phi_{1\_1Vref}$ or the third charge cycle switch $\Phi_{1\_3Vref}$. The choice of which of the second and third charge cycle switches $\Phi_{1\_1Vref}$, $\Phi_{1\_3Vref}$ to close is made in dependence upon the digital signal received from the ADC 7. If second charge cycle switch $\Phi_{1\_1VRef}$ is closed then only the voltage from first voltage supply 18 is applied to the capacitor 19 during the first clock cycle portion $\Phi_1$. Alternatively, if third charge cycle switch $\Phi_{1\_3VRef}$ is closed instead of the second charge cycle switch $\Phi_{1\_1VRef}$ then the voltage from both the first voltage supply 18 and the additional voltage supply 26 is applied to the capacitor 19. In total, when second charge cycle switch $\Phi_{1\_1Vref}$ is closed the voltage applied to the capacitor 19 is the first voltage $V_{ref}$, whereas when third cycle switch $\Phi_{1\_3Vref}$ is closed the voltage applied capacitor 19 is the first voltage $V_{ref}$ plus the second voltage $2V_{ref}$, so a third voltage $3V_{ref}$, three times the first voltage $V_{ref}$. As a result, the energy stored in the capacitor 19 during the first clock cycle portion $\Phi_1$ is dependent on which of the second charge cycle $\Phi_{1\_1Vref}$ switch and the third charge cycle switch $\Phi_{1\_3Vref}$ is closed during the first clock cycle portion $\Phi_1$.

During the second clock cycle portion $\Phi_2$ the switched capacitor output stage 8 illustrated in FIG. 2C operates analogously to that illustrated in FIG. 2A. As previously, the discharge cycle switches $\Phi_2$ are controlled by the digital signal received from the ADC 7 to determine the polarity of the charge pulses provided. However, the differing voltages that may be applied to the capacitor 19 during the first clock cycle portion $\Phi_1$ affect the level of the charge pulses provided during the second clock cycle portion $\Phi_2$. There are two possible polarities and two possible charge pulse levels. As a result, there are four possible outputs of the switched capacitor output stage 8. The switched capacitor output stage 8 may therefore reflect all possible values of the digital signal received from the 2-bit ADC 7.

For example, if the values of the symbols output of the ADC 7 are represented as 0, 1, 2 and 3, then: 0 can be represented by a pulse of negative polarity when the capacitor 19 has been charged by both the first voltage supply 18 and the second voltage supply 26; 1 can be can be represented by a pulse of negative polarity when the capacitor 19 has been charged by only the first voltage supply 18; 2 can be represented by a pulse of positive polarity when the capacitor 19 has been charged by only the first voltage supply 18; and 3 can be represented by a pulse of positive polarity when the capacitor 19 has been charged by both the first voltage supply 18 and the second voltage supply 26. One skilled in the art will recognise that alternative relationships between the values of the symbols in the digital signal received from the ADC 7 and the charge pulses provided by the switched capacitor output stage 8 can be used.

One skilled in the art will recognise that the principle of applying multiple different voltages to the capacitor 19 to reflect multiple values of the output of a 2-bit ADC 7 can be extended to ADCs with a higher bit rating. For example, in an alternative arrangement, the switched capacitor output stage can comprise a plurality of capacitors 19 which may be selectively charged by a single voltage supply in order to provide a range of output charge pulses. In some embodiments, a combination of different voltage supplies and different capacitors can be used to provide different charge pulses reflecting the different outputs of a multiple-bit ADC.

Figure 3A:
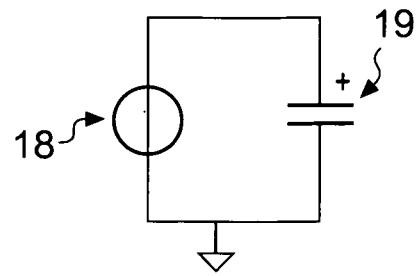
FIG. 3A illustrates a charging step of a capacitor in the switched capacitor output stage shown in FIG. 2A.

The charge and discharge processes of the capacitor 19 of the switched capacitor output stage 8 illustrated in FIG. 2A are explained in greater detail with reference to FIGS. 3A to 3C. FIG. 3A shows the charge process of the capacitor 19 during first clock cycle portion $\Phi_1$. As mentioned above, during this portion charge cycle switches $\Phi_1$ are closed and discharge cycle switches $\Phi_{2+}$, $\Phi_2$ are open. As a result, the effective circuit of the switched capacitor output stage 8 is as shown in FIG. 3A. The capacitor 19 is charged during this time.

Figure 3B:
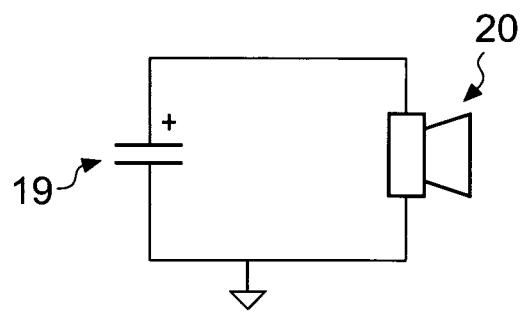
FIG. 3B illustrates a discharging step of the capacitor in the switched capacitor output stage shown in FIG. 2A.
Figure 3C:
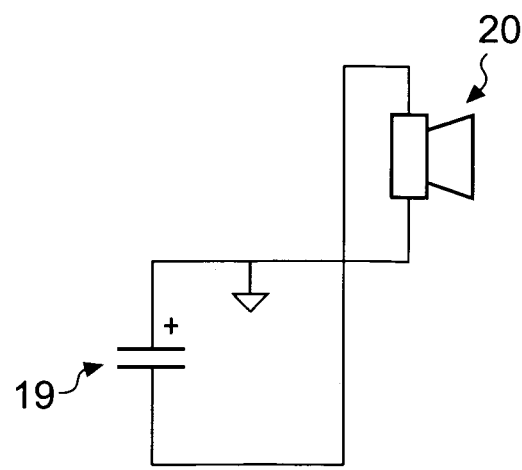
FIG. 3C illustrates an alternative discharging step of the capacitor in the switched capacitor output stage shown in FIG. 2A.

During the second clock cycle portion $\Phi_2$ either a positive or a negative charge pulse may be delivered to a speaker 20 and the resulting effective circuits and how these interact with the speaker 20 are illustrated in FIGS. 3B and 3C. FIG. 3B illustrates the effective circuit during the second clock cycle portion $\Phi_2$ when first discharge cycle switches $\Phi_{2+}$ are closed while second discharge cycle switches $\Phi_{2-}$ remain open in response to the digital signal received from the ADC 7. As mentioned previously, charge cycle switches $\Phi_1$ are open during this portion of the clock cycle. In contrast, FIG. 3C illustrates the effective circuit during the second clock cycle portion $\Phi_2$ when the second discharge cycle switches $\Phi_{2-}$ are closed while the first discharge cycle switches $\Phi_{2+}$ are open in response to the digital signal having the second value. As such, the effect of the digital signal received from the ADC 7 is to determine the polarity of the charge pulse applied to the speaker 20 during the second clock cycle portion $\Phi_2$.

The circuit described in FIGS. 1 to 3 therefore provides an output signal to the speaker 20 that contains positive and negative charge pulses. The speaker 20 is driven around a zero bias point and there is no DC component to the output signal used to drive the speaker 20. Moreover, at high clock frequencies the capacitor 19 can have a low enough capacitance to be incorporated directly onto a microchip. For example, a clock frequency of at least 20 MHz may be used, such as approximately 40 MHz. The preferred capacitance of the capacitor 19 depends on factors such as the desired output level, the impedence of the speaker 20 and the clock frequency. In a preferred embodiment, the capacitance of the capacitor 19 is 10 nF or less and in particularly preferred embodiments the capacitance of the capacitor 19 is approximately 1 nF. As such, the technique adopted can obviate the requirement for any additional pins on the microchip while providing an output that has no DC component.

Figure 4A:
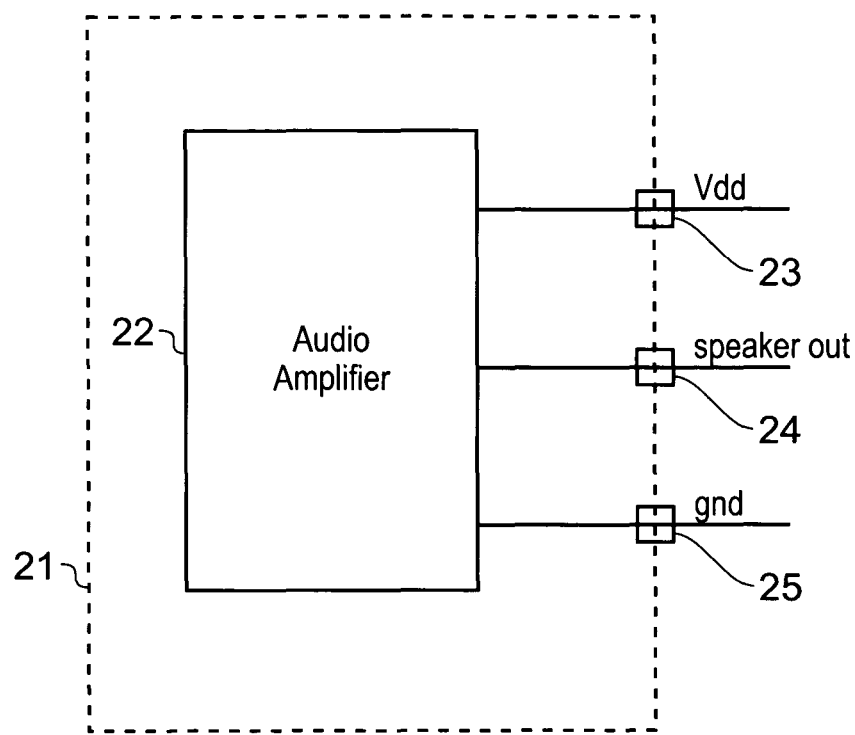
FIG. 4A is a schematic representation of an integrated circuit incorporating the amplifier shown in FIG. 1.

FIG. 4A is a schematic representation of an integrated circuit 21 or microchip incorporating the amplifier 1. The amplifier 1 is of the kind described above with reference to FIGS. 1 to 3C, although alternatives can be used. FIG. 4A illustrates three input/output ports (pins) 22, 23, 24 incorporated into the microchip 21. A first pin 22 is used to provide a supply voltage $V_{dd}$ to the amplifier 1, a second pin 23 is used to provide a connection to ground, and a third pin 24 is used to provide the output signal from the amplifier 1 to the speaker 20. The voltage supply 18 and additional voltage supply 26 can be powered by the supply voltage $V_{dd}$ or can be powered by an alternative voltage source or sources connected to the microchip by an additional pin or pins (not shown). The microchip 21 can also include a fourth pin (not shown) used to provide the analogue input signal.

Figure 4B:
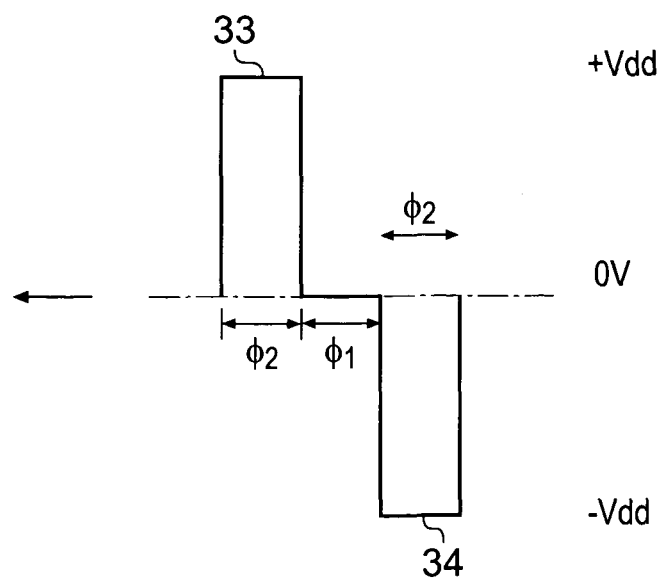
FIG. 4B illustrates a signal output by the amplifier shown in FIG. 1.

FIG. 4B shows an example of a waveform of the signal output by the switched capacitor output stage 8 illustrated in FIG. 2A. A positive charge pulse 33 and a negative charge pulse 34 are separated by a time span equal to the first clock cycle portion $\Phi_1$, and are centred on the zero voltage axis. In the example shown the positive pulse 33 and the negative pulse 34 are of equal magnitude, although one skilled in the art will realise that this is not necessarily the case in practical implementations. As mentioned previously, the signal output by the switched capacitor output stage 8 has no DC component.

The charge pulses 33, 34 shown in FIG. 4B have a square wave profile. This is shown for indicative purposes only, and one skilled in the art will recognise that in practice the profile of the charge pulses 33, 34 may differ from that shown. For example, the profile of the charge pulse may depend on a number of characteristics of the system, including, but not limited to: the current in the output signal, the capacitance of the capacitor, and the clock frequency. The profile of the pulse will also be affected by the inductance of the coil in the speaker, which will act to resist changes in current. It is possible in some circumstances for the charge pulse to take such a profile that the voltage across the output is reversed during the charge pulse (that is, during the second clock cycle portion $\Phi_2$). One skilled in the art will understand that references to the polarity of the charge pulse in this document refer to the initial polarity of the charge pulse.

Figure 5:
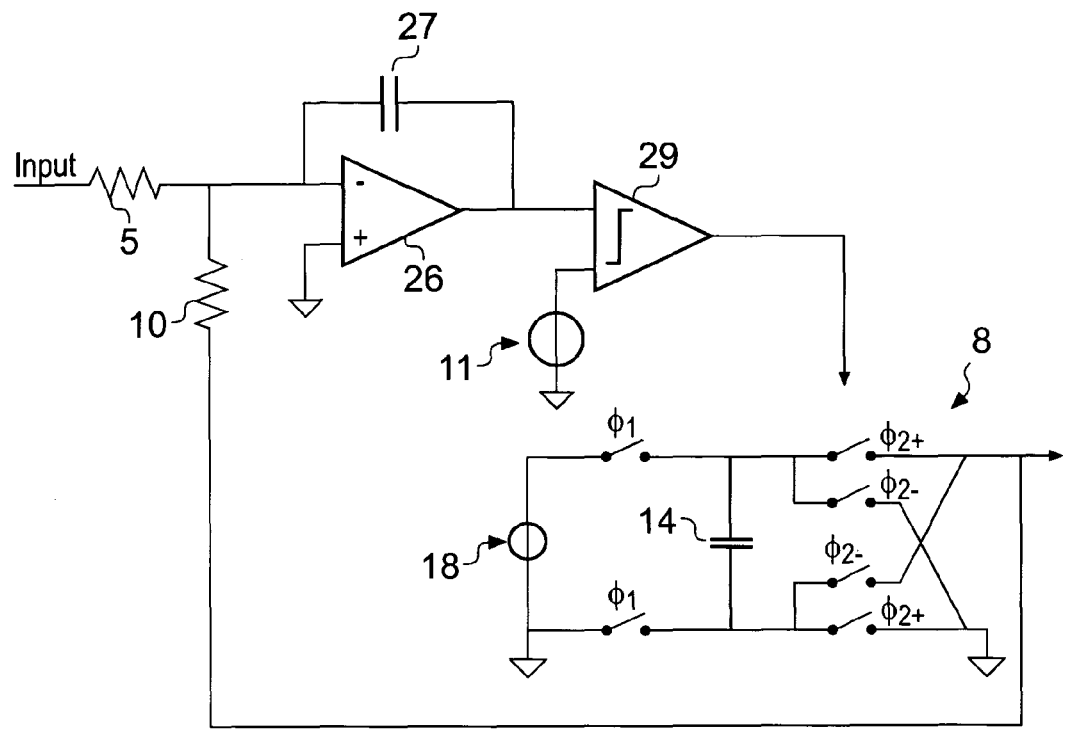
FIG. 5 is a schematic representation of a circuit of the amplifier shown in FIG. 1.

FIG. 5 is a schematic representation of a particular circuit that may be used to implement the amplifier 1 shown in FIG. 1. One skilled in the art will recognise that alternative implementations are possible.

In the circuit shown in FIG. 5, an op-amp 26 with a capacitive element 27 coupled in parallel to it is used to implement the pre-amplifier 6. The ADC 7 is a 1-bit ADC implemented by a comparator 29. The comparator 29 is driven by the output of the op-amp 26 and the clock signal 11. One skilled in the art will recognise that the pre-amplifier 6 and the ADC 7 can be implemented by a variety of alternative techniques according to requirements.

The switched capacitor output stage 8 illustrated in FIG. 5 takes the form of that illustrated in FIG. 2A. The switched capacitor output stage 8 is driven by the clock signal 11 and the digital signal output by the comparator 29 to manipulate the charge cycle switches $\Phi_1$ and discharge cycle switches $\Phi_{2+}$, $\Phi_2$ as discussed above in order to produce charge pulses in an output signal used to drive the speaker 20.

Figure 6:
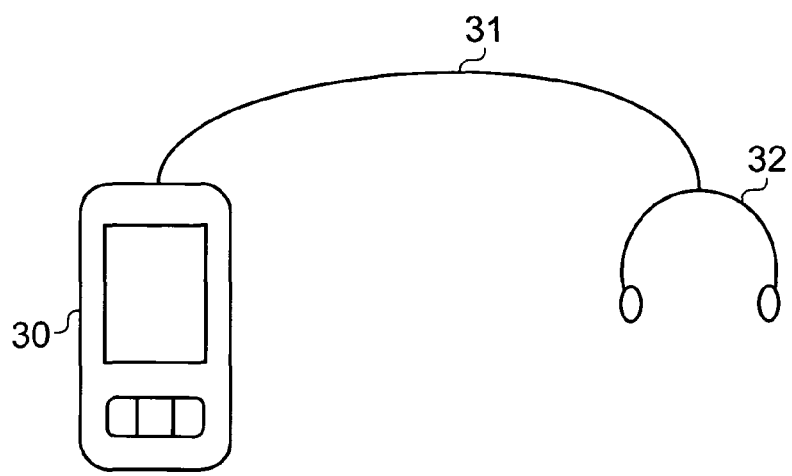
FIG. 6 is a schematic representation of a portable audio device incorporating the amplifier shown in FIG. 1.

FIG. 6 illustrates a portable audio device 30 which incorporates a circuit such as that illustrated in FIG. 5. The output of the circuit is transmitted over a wire 31 to the speaker 20 which is contained in a pair of headphones 32. In alternative embodiments, the circuit may be integrated with the headphones 32 rather than the portable audio device 30.

The embodiments described above utilise a single switched capacitor output stage 8. However, in alternative embodiments one or more additional switched capacitor output stages may be included.

Figure 7A:
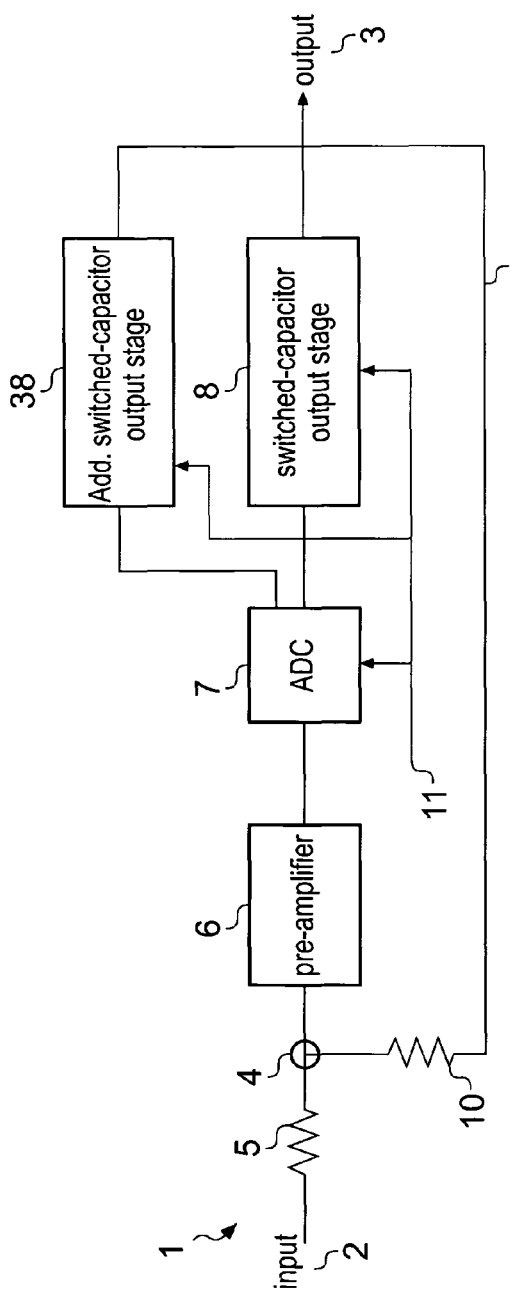
FIG. 7A is a schematic representation of an amplifier comprising an additional switched capacitor output stage.
Figure 7B:
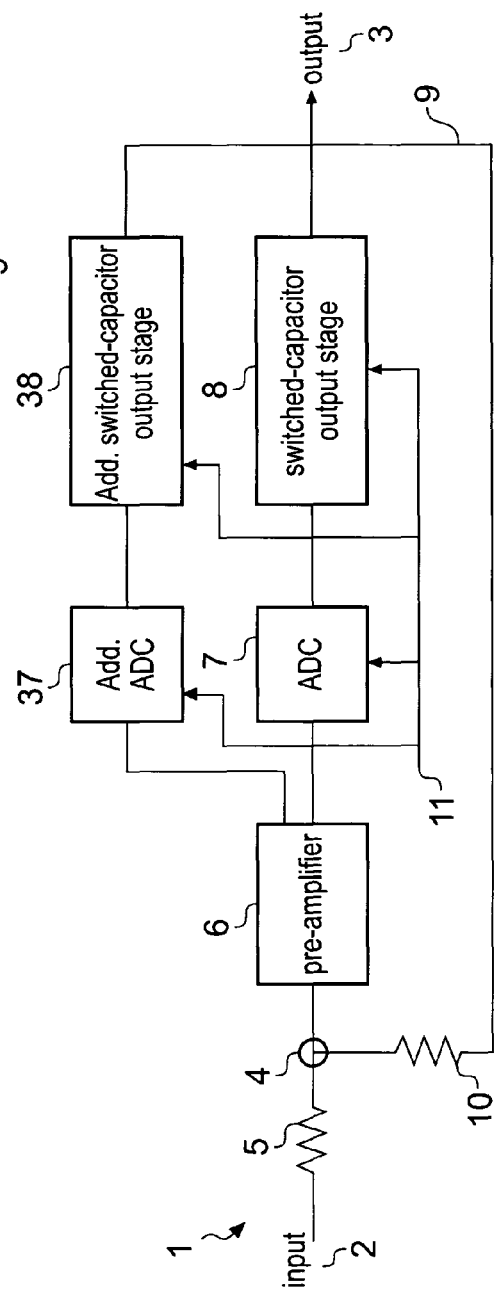
FIG. 7B is a schematic representation of an amplifier comprising an additional switched capacitor output stage and an additional ADC.

FIGS. 7A and 7B illustrate alternative embodiments which incorporate an additional switched capacitor output stage 38. Referring to the embodiment described in FIG. 7A, the additional switched capacitor output stage 38 is coupled from the ADC 7 to the output 3 in parallel to the switched capacitor output stage 8 which has been previously described. Similarly, the additional switched capacitor output stage 38 is also coupled to the clock signal 11.

The additional switched capacitor output stage 38 is broadly of the same construction as the switched capacitor output stage 8 already described, but is arranged to charge an additional energy storage element (not shown) during the second clock cycle portion $\Phi_2$ and discharge the additional energy storage element during the first clock cycle portion $\Phi_1$. As a result, the additional switched capacitor output stage 38 provides charge pulses during the first clock cycle portion $\Phi_1$ to complement those produced by the switched capacitor output stage 8 during the second clock cycle portion $\Phi_2$. The polarity of the charge pulses provided by the additional switched capacitor output stage 38 depends on the value of symbols in the digital signal provided by the ADC 7 in the manner described above for the switched capacitor output stage 8. Although the pulses provided by the switched capacitor output stage 8 and the additional switched capacitor output stage 38 occur at different portions during the clock cycle, they can be controlled by the same symbols in the digital signal received from the ADC 7.

In some preferred embodiments, the symbols received from the ADC 7 include a first symbol immediately preceding a second symbol. The switched capacitor output stage 8 and the additional switched capacitor output stage can both be arranged to produce charge pulses, the polarity of which depends on the first symbol, during a period in which the second symbol is received. The periods during which the first and second symbols are received from the ADC 7 are clock cycles divided into two clock cycle portions as described above. The first and second clock cycle portions of the first clock cycle during which the first symbol is received from the ADC 7 will be referred to hereinafter as $\alpha_1$ and $\alpha_2$ respectively, while the first and second clock cycle portions of the second clock cycle during which the second symbol is received from the ADC 7 will be referred to hereinafter as $\beta_1$ and $\beta_2$ respectively. These clock cycle portions $\alpha_1$, $\alpha_2$, $\beta_1$, $\beta_2$ are equivalent to clock cycle portions $\Phi_1$, $\Phi_2$ described above.

The switched capacitor output stage 8 is arranged to charge the energy storage element 19 during the first clock cycle portion $\beta_1$ of the second clock cycle and to discharge the energy storage element 19 during the second clock cycle portion $\beta_2$ of the second clock cycle. In contrast, the additional switched capacitor output stage 38 is arranged to charge the additional storage element during the second clock cycle portion $\alpha_2$ of the first clock cycle and to discharge the additional energy storage element during the first clock cycle portion $\beta_1$ of second clock cycle. As such, during the second clock cycle two charge pulses are produced in the output signal; that is, a first charge pulse is produced by the additional switched capacitor output stage 38 during the first clock cycle portion $\beta_1$ and then a second charge pulse is produced by the switched capacitor output stage 8 during the second clock cycle portion $\beta_2$. Both the first and second charge pulses have a polarity which depends upon the value of the first symbol received from the ADC 7 during the first clock cycle. The process can then repeat with the second symbol taking the place of the first symbol and a subsequent symbol taking the place of the second symbol.

FIG. 7B illustrates a further alternative embodiment which comprises an additional ADC 37. The additional ADC 37 is coupled from the pre-amplifier to the additional switched capacitor output stage 38 in parallel to the ADC 7 described above. In the embodiment illustrated in FIG. 7B, the output of the additional ADC 37 is used to determine the output of the additional switched capacitor output stage 38.

One skilled in the art will recognise that the more switched capacitor output stages may be included even beyond those illustrated in FIGS. 7A and 7B. For example, the clock cycle may be divided into three or more separate portions (rather than two as described above) and separate switched capacitor output stages may be provided to produce a charge pulse in each of these portions. Further additional ADCs may be provided to control the further additional switched capacitor output stages.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A circuit comprising:
an input for receiving an analogue input signal;
an analogue-to-digital conversion stage operable to convert the analogue input signal into a digital signal comprising a plurality of symbols each having one of a plurality of different values; and
a first output stage coupled to receive the digital signal from the analogue-to-digital conversion stage, the first output stage comprising a first energy storage element and being operable to discharge the first energy storage element to produce first charge pulses in an output signal, the polarity of the first charge pulses depending upon values of the symbols received from the analogue-to-digital conversion stage.

2. The circuit according to claim 1, wherein the first output stage is operable to discharge the first energy storage element periodically.

3. The circuit according to claim 1, wherein the analogue-to-digital conversion stage is operable to output the digital signal at a symbol rate, the symbol rate defining a number of symbols in the digital signal per unit of time.

4. The circuit according to claim 3, wherein the first output stage is operable to discharge the first energy storage element at the symbol rate.

5. The circuit according to claim 3, wherein the symbol rate is at least 20 MHz.

6. The circuit according to claim 3, wherein the symbol rate is approximately 40 MHz.

7. The circuit according to claim 1, wherein the first energy storage element is a capacitive element.

8. The circuit according to claim 7, wherein the capacitive element has a capacitance of less than 10 nF.

9. The circuit according to claim 7, wherein the capacitive element has a capacitance of approximately 1 nF.

10. The circuit according to claim 1, wherein the symbols are each received from the analogue-to-digital conversion stage in a period of time comprising a first portion and a second portion, and the first output stage is operable to charge the first energy storage element during the first portion and discharge the first energy storage element to produce one of the first charge pulses during the second portion.

11. The circuit according to claim 10, wherein the first portion precedes the second portion.

12. The circuit according to claim 1, further comprising a second output stage coupled to receive the digital signal from the analogue-to-digital conversion stage, the second output stage comprising a second energy storage element and being operable to discharge the second energy storage element to produce second charge pulses in the output signal, the polarity of the second charge pulses depending upon values of the symbols received from the analogue-to-digital conversion stage.

13. The circuit according to claim 12, wherein the first and second charge pulses are alternately and sequentially produced.

14. The circuit according to claim 12, wherein the symbols are each received from the analogue-to-digital conversion stage in a period of time comprising a first portion and a second portion, and the second output stage is operable to charge the second energy storage element during the second portion and discharge the second energy storage element to produce one of the second charge pulses during the first portion.

15. The circuit according to claim 12, wherein, for a second symbol following a first symbol of the digital signal, the second output stage is operable to charge the second energy storage element during a/the period of time in which the first symbol is received from the analogue-to-digital conversion stage and to discharge the second energy storage element to produce one of the second charge pulses, the polarity of which depends upon the value of the first symbol, during a/the period of time in which the second symbol is received from the analogue-to-digital conversion stage.

16. The circuit according to claim 15, wherein the second output stage is operable to charge the second energy storage element during a/the second portion of the period of time in which the first symbol is received from the analogue-to-digital conversion stage and to discharge the second energy storage element to produce one of the second charge pulses, the polarity of which depends upon the value of the first symbol, during a/the first portion of the period of time in which the second symbol is received from the analogue-to-digital conversion stage.

17. The circuit according to claim 16, wherein the first output stage is operable to charge the first energy storage element during a/the first portion of the period of time in which the second symbol is received from the analogue-to-digital conversion stage and to discharge the first energy storage element to produce one of the first charge pulses, the polarity of which depends upon the value of the first symbol, during a/the second portion of the period of time in which the second symbol is received from the analogue-to-digital conversion stage.

18. The circuit according to claim 15, wherein the first symbol of the digital signal immediately precedes the second symbol of the digital signal.

19. The circuit according to claim 12, wherein the analogue-to-digital conversion stage comprises an analogue-to-digital converter operable to convert the analogue input signal into the digital signal received both by the first output stage and by the second output stage.

20. The circuit according to claim 1, wherein a level of each charge pulse depends upon the value of the symbol upon which the polarity of that charge pulse depends.

21. The circuit according to claim 1, wherein the symbols of the digital signal(s) have a selected one of three different values including zero and the charge pulses have one polarity when the symbol upon which its polarity depends has one of the non-zero values and the opposite polarity when that symbol has the other of the non-zero values.

22. The circuit according to claim 1, wherein the symbols of the digital signal(s) have a selected one of four different values and the charge pulses have one polarity and a first level when the symbol upon which its polarity depends has a first of the values, the one polarity and a second level when the symbol upon which its polarity depends has a second of the values, the opposite polarity and the first level when the symbol has a third of the values and the opposite polarity and the second level when the symbol has a fourth of the values.

23. The circuit according to claim 1, wherein the symbols of the digital signal(s) have a selected one of two different values and the charge pulses have one polarity when the symbol upon which its polarity depends has one of the values and the opposite polarity when that symbol has the other of the values.

24. The circuit according to claim 1, further comprising a pre-amplifier coupled between the input and the analogue-to-digital conversion stage.

25. The circuit according to claim 1, further comprising a feedback path coupled between an output of the output stage and the input of the circuit.

26. An amplifier comprising the circuit of claim 1.

27. The amplifier according to claim 26, wherein the amplifier is integrated onto a single microchip.

28. The amplifier according to claim 26, wherein the amplifier is an audio amplifier.

29. A portable audio device, comprising the amplifier of claim 28.

30. A method comprising:
receiving an analogue input signal;
converting the analogue input signal to a digital signal comprising a plurality of symbols each having one of a plurality of different values; and
receiving the digital signal and discharging a first energy storage element to produce first charge pulses in an output signal, the polarity of the first charge pulses depending upon values of the symbols in the digital signal.

* * * * *